United States Patent [19]

Nelson

[11] Patent Number: 4,876,699
[45] Date of Patent: Oct. 24, 1989

[54] HIGH SPEED SAMPLED DATA DIGITAL PHASE DETECTOR APPARATUS

[75] Inventor: Blaine J. Nelson, Plano, Tex.

[73] Assignee: Rockwell International Corporation, El Segundo, Calif.

[21] Appl. No.: 190,914

[22] Filed: May 6, 1988

[51] Int. Cl.[4] .............................................. H03D 3/18
[52] U.S. Cl. ..................................... 375/82; 375/118; 329/345
[58] Field of Search ................................... 375/80–87, 375/94, 119, 120, 118; 329/50, 110, 112, 122; 328/133; 307/514

[56] References Cited

U.S. PATENT DOCUMENTS

| | | | |
|---|---|---|---|
| 3,729,684 | 4/1973 | Shuda | 375/85 |
| 4,246,654 | 1/1981 | Malm | 375/83 |
| 4,322,851 | 3/1982 | Vance | 375/80 |
| 4,368,434 | 1/1983 | Miller et al. | 375/80 |
| 4,651,108 | 3/1987 | Okita et al. | 375/83 |
| 4,756,011 | 7/1988 | Cordell | 375/86 |
| 4,771,421 | 9/1988 | Karlsson et al. | 370/85 |

Primary Examiner—Robert L. Griffin
Assistant Examiner—Stephen Chin
Attorney, Agent, or Firm—Bruce C. Lutz; V. Lawrence Sewell; H. Fredrick Hamann

[57] ABSTRACT

A digital implementation of an analog phase detector is illustrated, wherein the novel aspect is the use of a low speed clock, which is passed through a delay line to provide ten different phases of clock signal. The circuitry is used to generate digital numbers on a basis similar to the pulses in an analog equivalent, which numbers are summed to provide a phase detected output.

7 Claims, 5 Drawing Sheets

HIGH SPEED SAMPLED DATA DIGITAL PHASE DETECTOR APPARATUS

THE INVENTION

The present invention is generally related to electronics and more specifically related to digital electronics. Even more specifically, the invention is related to a circuit for providing phase detection of non-return-to-zero incoming data wherein the frequency of the reference clock used in conjunction with the phase detector is of a similar frequency to that of the data being phase detected.

BACKGROUND

Phase detection techniques have covered a wide variety of circuit implementations one example of which is a patent to Charles Hogge, Jr., U.S. Pat. No. 4,535,459, assigned to the same assignee as the present invention. Another example is shown as FIG. 1 in the present application of prior art since it is easy to understand. The circuit of FIG. 1 is also shown because the operation of the present invention has a digital operational analogy to the operation of the analog circuit of FIG. 1.

An advantage of the prior art analog circuits is that they did not have to operate at a frequency higher than the signal being phase detected. On the other hand, prior art "digital" phase detection circuits typically used a much higher frequency reference signal than the frequency of the signal being phase detected so as to get adequate resolution in the phase detection of the signal.

The present invention uses a set of signals N which are separated in phase by a uniform amount of 360/N degrees where the frequency of the signals is similar to that of the data being phase detected. The phase of the data signal relative a locally generated reference clock associated with the data signal is ascertained by counting the number of the set of N signals which have a transition from logic 0 to a logic 1 between the start of the data signal and a zero-to-one transition of the associated reference clock. The number of signals of the set performing such a transition is an indication of the relative phase between the two signals. If the set comprises ten signals and a count of five is detected, the relative phase of the data and the reference clock is in a desired state. If the relative phase deviates more than a set amount such as greater than six or less than four counts, an increment or decrement signal is issued to the oscillator producing the reference clock signal to correct the phase in the appropriate direction so that the relative phase between the data signal and the associated reference clock returns to the correct range.

It is thus an object of the present invention to provide an improved phase detector using digital techniques to reduce power consumption and increase the response time. By increasing the response time, I mean the response is much faster primarily due to the fact that analog circuits require filtering and filtering circuits generally have a low bandwidth thus adversely affecting the response time whereas digital circuits do not require any such filtering.

Other objects and advantages will be apparent from a reading of the specification and appended claims in conjunction with the drawings wherein:

DETAILED DESCRIPTION

Figure 1:
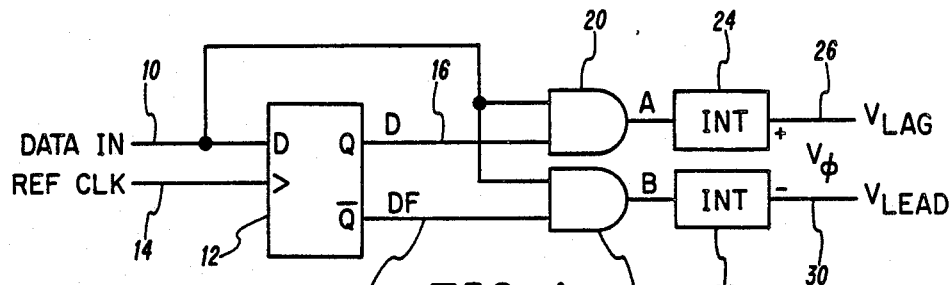
FIG. 1 is a representation of a prior art analog circuit used in explaining the operation of the present invention.

In FIG. 1 a data IN signal lead 10 supplies signals to a D flip-flop 12 having a reference clock input on lead 14. The D flip-flop 12 has outputs D and DF on leads 16 and 18 respectively, applied to AND gates 20 and 22 as shown. The data IN signal on lead 10 is applied to the other input of each of the AND gates 20 and 22. An output of AND gate 20 is supplied to an integrator 24 which provides a voltage lag (Vlag) output on lead 26 while the output from AND gate 22 is supplied to an integrator 28 which has a voltage lead (Vlead) output on a lead designated as 30.

Figure 2:
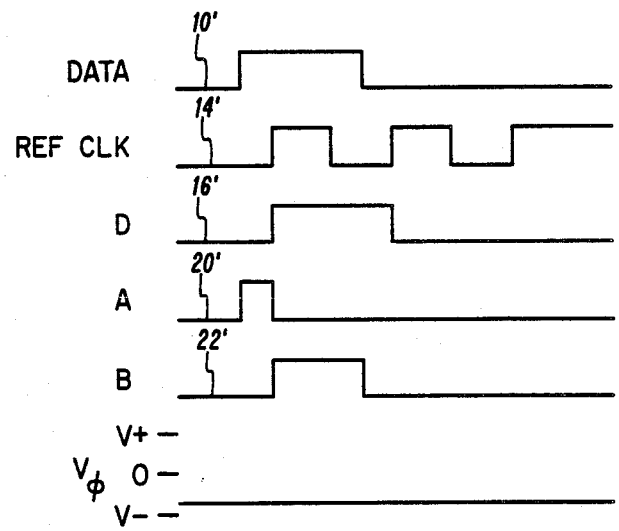
FIG. 2 is a set of waveforms used in explaining the prior art of FIG. 1.
Figure 3:
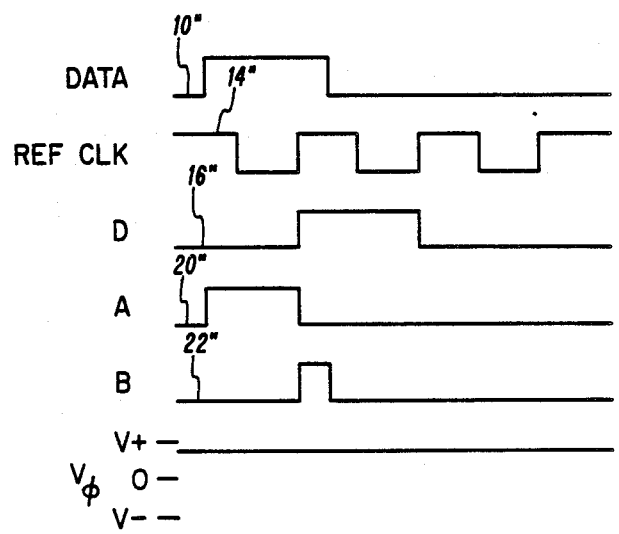
FIG. 3 is a set of waveforms for providing further explanatory material with respect to the prior art of FIG. 1.

In FIG. 2 waveforms are shown wherein a waveform designated as 10' signifies a NRZ type data waveform with a single isolated pulse representing the data IN on lead 10. A reference clock waveform labeled 14' represents the waveform of the clock signal on lead 14 of FIG. 1. The waveform D of FIG. 2 also labeled as 16' represents the output on the D output of flip-flop 12. The waveforms labeled as A and B and further as 20' and 22 represent the outputs from AND gates 20 and 22. The final waveform $V_0$ represents the composite waveform appearing between leads 26 and 30 of FIG. 1. FIG. 3 uses the same designators as FIG. 2 except that there are '' (double primes) for each of the designators corresponding to FIG. 2.

While the data is shown as being single isolated NRZ pulse, additional circuitry could be used in FIG. 1 to operate successfully with the non-return-to-zero data of the present invention but the explanation of operation would be more complicated.

Figure 4:
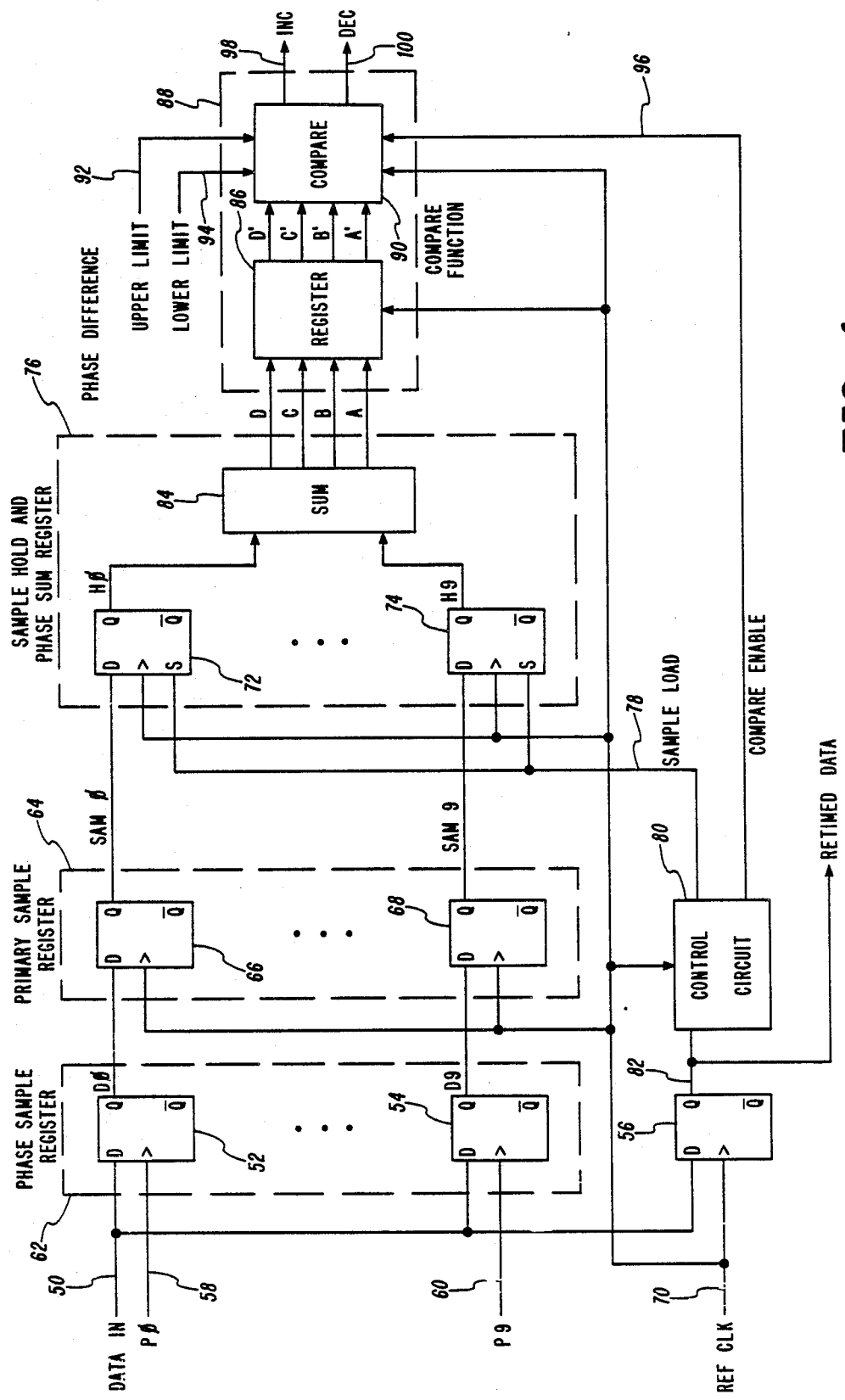
FIG. 4 is a block diagram illustrating one embodiment of a digital implementation of the present invention.
Figure 5:
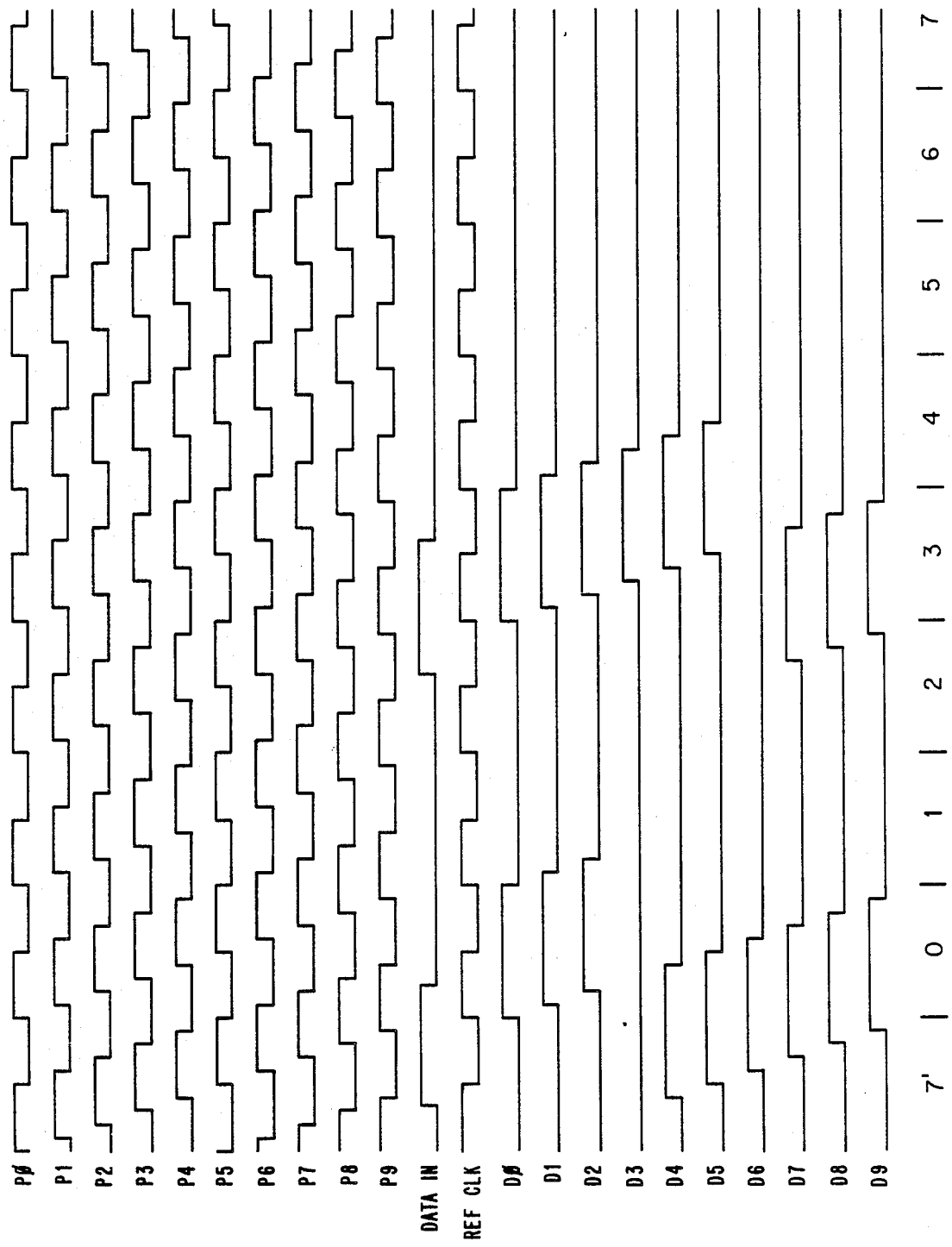
FIG. 5 is a first set of waveforms used in explaining the operation of FIG. 4.
Figure 6:
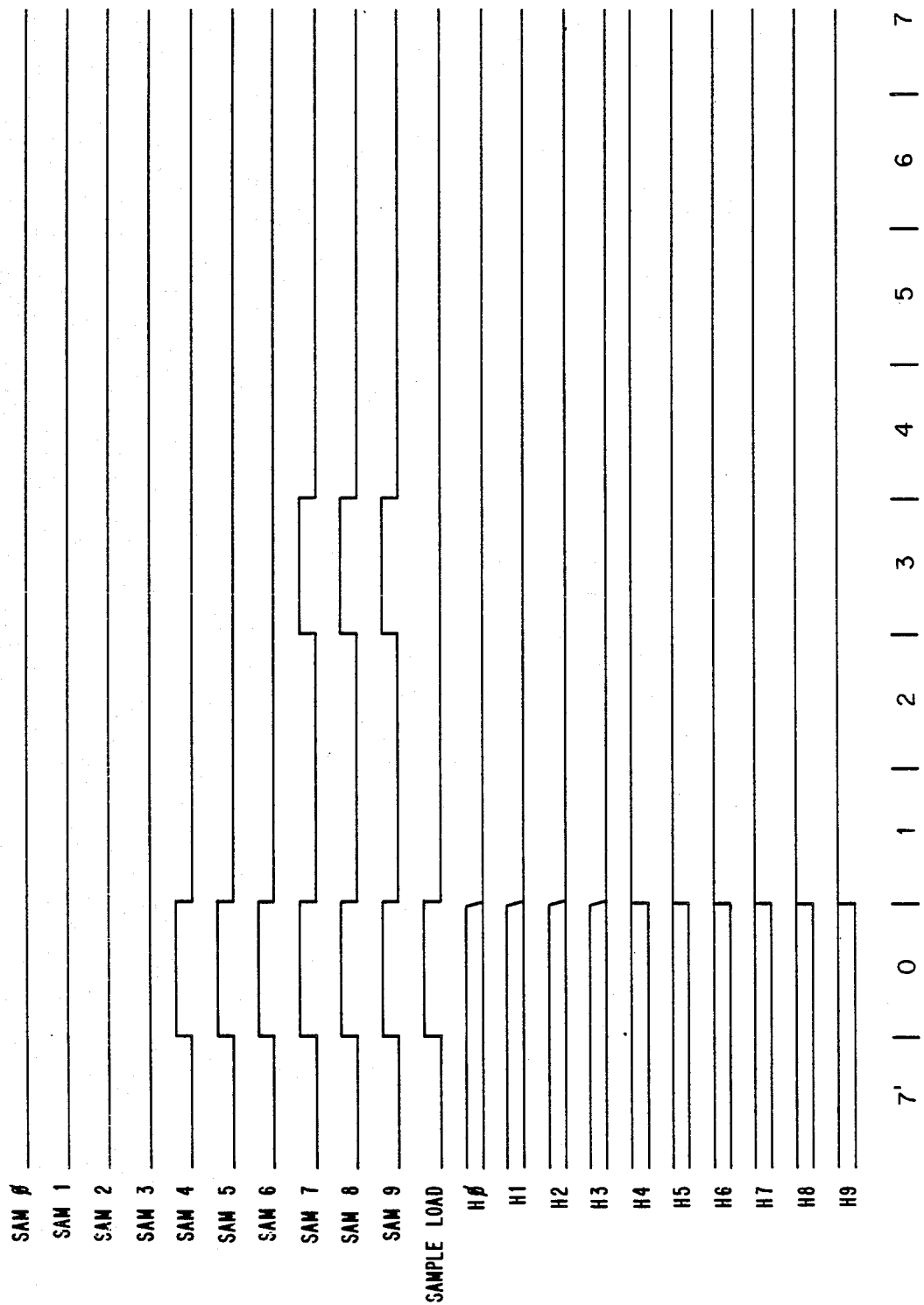
FIG. 6 is a second set of waveforms used in conjunction with FIG. 5 for explaining the operation of FIG. 4.

In FIG. 4 a non-return-to-zero input lead 50 supplies signals to a D flip-flop 52. Flip-flop 52 is one of a set of ten (N) D flip-flops wherein the last flip-flop is designated as 54. The data input signal is applied to the D input of each of these ten flip-flops. The signal is also applied to a further D flip-flop 56. The clock inputs of each of the N flip-flops from 52 to 54 receives an input from set of leads N labeled from P0 or 58 to P9 or 60. The waveforms of each of these phased inputs are illustrated in FIG. 5 and the phase of the signals appearing on these leads is phase shifted from adjacent signals by 360 divided by N or, in other words, 36 degrees. The D flip-flops from 52 to 54 comprise a phase sample register which is generally designated as 62. The outputs of each of these flip-flops within phase sample register 62 is supplied to a corresponding D flip-flop within a primary sample register generally designated as 64. Shown within sample register 64 is a first D flip-flop 66 corresponding in position to flip-flop 52 of register 62. A final D flip-flop 68 within register 64 receives its inputs from the flip-flop 54 of register 62. The outputs of each of the flip-flops within phase sample register 62 are given designations from D0 through D9 and these waveforms are illustrated in FIG. 5 with the D designations. The outputs of each of the D flip-flops from 66 to 68 within register 64 are given designations from SAM0 or sample 0 to SAM9. These waveforms are shown in FIG. 6. The D flip-flops of register 64 as well as D flip-flops 56 receive reference clock inputs from a lead designated as 70. The sample outputs from register 64 are supplied to ten D flip-flops from flip-flop 72 to flip-flop 74 within a sample and hold and phase sum register block generally designated as 76. The reference control signal is supplied to a clock input on each of the D flip-flops 72 through 74 and an additional sample load signal is supplied to an S input of each of these flip-flops. Thus, the D flip-flops 72 through 74 require not only the rising edge of a clock but also that the sample load input be a logic 1 before it will accept the SAM inputs and hold these signals as outputs ranging from H0 to H9. The waveforms of the signals H0 through H9 are illustrated in FIG. 6 along with the sample load signal appearing on a lead 78 as output by a control circuit 80 which receives inputs both from the reference clock 70 and from flip-flop 56 on a lead 82 which is the recovered data output. The signals H0 through H9 are all supplied to a summing circuit block 84 which counts the number of inputs which are a logic 1 and provides a conversion to a binary value shown as outputs A through D from the sample hold and phase sum register 76. These outputs A through D are supplied to a register 86 within a compare function block 88. The register 86 receives clock inputs from lead 70 and provides outputs of A' through D' after the occurrence of the next clock and supplies these outputs to a compare circuit 90 within compare function block 88. Upper and lower limits are supplied respectively on leads 92 and 94 to the compare block 90. A compare enable lead 96 is also supplied to compare block 90 from control circuit 80. The compare block 90 compares the binary input value supplied on leads A' through D' with the upper and lower limits as supplied on leads 92 and 94 and provides an increment or decrement signal on leads 98 or 100 if the binary input either exceeds or is less than the limits set on leads 92 and 94.

Figure 7:
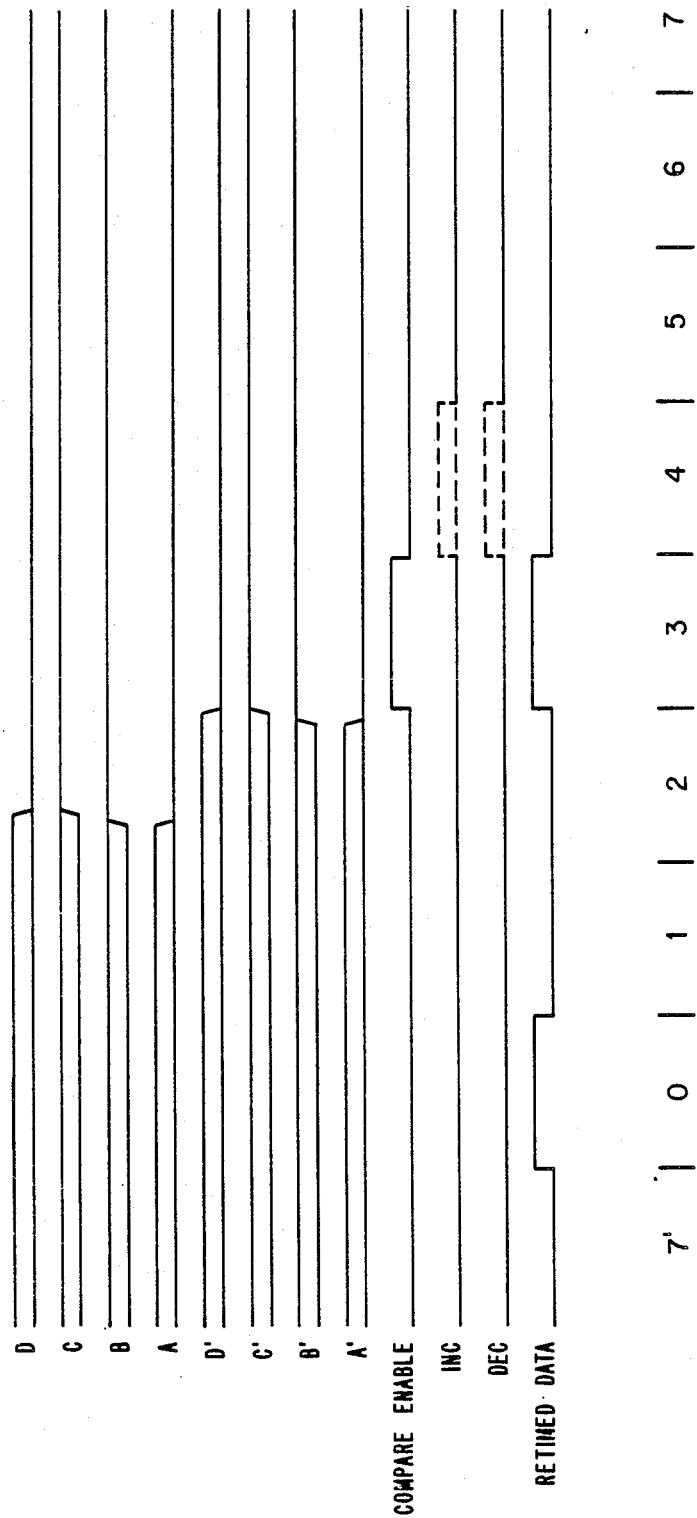
FIG. 7 is a final set of waveforms used in conjunction with the waveforms of FIGS. 5 and 6 to explain the operation of FIG. 4.

In view of the labeling of FIG. 4, it is believed that the correspondence of the waveforms in FIGS. 5, 6 and 7 to the appropriate leads of FIG. 4 are obvious and directly applicable. However, a few explanatory remarks will be provided. As previously discussed, the signals P0 through P9 are a set (N) of signals which are phase shifted relative to one another by an amount of one electrical cycle divided by N or, in other words, 360 degrees divided by ten which equals 36 degrees. The waveforms D0 through D9 are waveforms which correspond in length to one electrical cycle of the P waveforms and commence after a data IN signal changes from logic 0 to logic 1. This data IN signal being a non-return-to-zero signal may extend over many time periods as defined by the circuit state representation in each of the FIGS. 5, 6 and 7. In such a case, the waveform of the D signals would extend for the duration of the data IN signal. It is this non-return-to-zero attribute of the data signal which entails part of the complexity of the present inventive concept. The primary sample register 64 makes provisions for this in limiting the output signals of sample 0 through 9 to a single time period which corresponds to one electrical cycle of the reference clock signal. Further, the sample signals comprise only those D signals which were a logic 1 at the time of the zero-to-one transition of the reference clock. The H waveforms show both logic levels up to the end of state 0 since this is a "don't care" condition, but at the commencement of state 1 if the signal amplitudes were not the appropriate value, they would be changed to the appropriate value. Thus, there is a downward slope in the signal waveforms from H0 to H3 and there is a rise in the signal waveforms from H4 through H9 corresponding with the fact that the SAM signals from 4 through 9 were a logic 1 during state 0. The summing device 84 has a propagation time of greater than 1 electrical cycle of the reference clock and thus, it is illustrated that the signals from A through D occur sometime during state 2 and they are output from register 86 later in state 2 such that they are at their appropriate values during state 3. The compare enable signal applied to compare block 90 provides the comparison function during state 3 and if there is a requirement for an increment or a decrement signal, it would appear on the appropriate output lead during state 4. Thus, the increment and decrement (INC and DEC) signals are shown as dash lines to show that they may be a logic 1 during this state. The recovered data is merely retimed data timed to the period of the reference clock signal.

OPERATION

As indicated above, the function of the present circuit is to derive the average phase difference between the commencement of a data pulse and the commencement of a reference clock signal. By definition herein, the commencement of each of these signals is when there is a change from a logic 0 to a logic 1.

As illustrated in FIG. 2 for the prior art, when the reference clock leads the data by more than one-half electrical cycle, the duration of A is longer than the duration of signal B as shown in FIG. 3. Under these circumstances, the integration of the pulses A and B result in the voltage Vlag being larger than the voltage Vlead. This voltage in an analog system is used to control a voltage controlled oscillator to adjust the reference clock back to a condition where its zero-to-one logic change occurs midway through a data time period. The opposite results occur when there is a lagging of the reference clock with respect to the data as shown in FIG. 2.

As previously mentioned, the prior art digital circuits have used a very high frequency source as a means for quantizing the data and/or reference signal in an attempt to provide phase discrimination. The present invention accomplishes the same end result while using a frequency source of approximately the same frequency as the reference frequency. The frequency source in the embodiment of the invention shown, produces ten signals from P0 to P9, all of which are the same frequency but each of which has a uniformly different phase from the adjacent signals. These signals from P0 to P9 are applied to the D flip-flops in the phase sample register 62 along with the non-return-to-zero data. While the present invention will work with return-to-zero data, the non-return-to-zero characteristics of the data do complicate the resultant circuit design of the present invention. The beginning of a P input to each of the flip-flops is passed to the output as a D output from D0 to D9 at and during the time that the data signal applied on lead 50 is a logic 1. If the data on lead 50 remains a logic 1 over several time periods, the output D line from each of the flip-flops will also remain at a logic 1.

The D flip-flops from 66 through 68 in the primary sample register 64 are used to filter out those signals from D0 through D9 which commence after the start of the reference clock. As will be observed from FIG. 6, samples 4 through 9 are all passed from the primary sample register 64 to the sample hold and phase sum register 76. The signals from P0 to P3 each commence after the start of the reference clock and thus, do not appear on the SAM outputs. The D flip-flops within register 76 have an S or select/hold input which is required in addition to the reference clock signal on lead 70 before the D flip-flop will pass the input to the output H leads. Thus, as shown in FIG. 6, the H outputs which are indeterminate in time periods 7' and 0 become a logic 1 for leads H4 through H9 at the commencement of time period 1 while the leads H0 through H3 are definitely placed in a logic 0 condition at the commencement of time period 1. The time of propagation through the summing network 84 is such that two time periods were allowed for the summing of the leads H0 through H9 in the summing device 84 to produce an equivalent binary output on leads A through D. This action is shown in FIG. 7 part way through time period 2 and it shows that there is an output from register 86 near the end of time period 2. In time period 3, the compare block, in response to inputs both from the reference clock on lead 70 and the compare enable lead 96 compares the binary input to values set on leads 92 and 94. In one embodiment of the invention the upper limit was six and the lower limit was four. In other words, if the binary input on leads A' through D' exceeded six, an increment output (INC) was provided on lead 98 while if the binary input on leads A' through D' was less than four, a decrement output (DEC) was provided on lead 100 to change the associated oscillator to a lower frequency whereby the reference clock and the data input pulse were synchronized again to substantially exactly one-half electrical cycle apart.

If the multiple P signals were not used and the same accuracy was desired as obtained in the present invention, a signal source operating at 500 megahertz would have to be used in order to phase discriminate the 50 megahertz reference clock signal of the present invention. At this point in circuit technology, gallium arsenide (GaAs) circuitry would likely have to be used to operate at such a frequency. Such circuitry is not only expensive but it consumes much greater power than the CMOS circuitry that was usable in the present inventive concept.

Although the upper and lower limits as applied to inputs 92 and 94 were fixed in one embodiment of the invention, these limits could be changed adaptively to accommodate an input signal with wide variations in pulse width.

The response time of digital circuitry such as shown in the present invention is much quicker than the analog prior art of FIG. 1 since such circuitry of the prior art uses integrators which have a very low bandwidth. Thus, only seven time intervals are required between the sampling of a phase difference and an actual adjustment of the phase of reference clock. Although nothing is shown in the Figures as happening during time periods 5, 6, and 7, this time is utilized by the system to provide the adjustment in the digital oscillator associated with this phase detector. Such an amount of time lapse is adequate to effect the phase adjustment so that the phase detector can take a new reading after six time intervals and the new reading will be an accurate reflection on whether or not any more adjustment is needed.

In summary, the present invention uses a multiplicity of phase related P signals to derive a plurality of SAM signals which are indicative of those P signals commencing between the commencement of a data signal and the commencement of a reference clock signal. The number of these SAM signals are compared with reference limits in a compare circuit for the purpose of generating an increment or decrement signal if the count of the SAM signals indicates that the relative phase of the data signal and the reference clock exceeds a usable range.

While a single embodiment of the inventive concept has been illustrated, alternate approaches have been discussed. I wish to be limited not by the information presented heretofore, but only by the scope of the appended claims wherein I claim.

I claim:

1. High speed digital phase detector apparatus comprising, in combination:

signal supplying first means for supplying a plurality of first signals of the same frequency but each of a different relative phase with respect to a reference;

data signal supplying second means for supplying logic level changing data signals which change at a given maximum data rate;

clock signal third means for supplying a reference clock signal which periodically provides a given logic level change at a frequency which may be similar to that of the given maximum data rate but is not synchronized to the data signal;

logic signal fourth means, connected to said first, second and third means for receiving signals therefrom and including signal output means, for counting the number of first signals that change to a given logic level between the time of occurrence of commencement of a data signal and the time of occurrence of the given logic level change of said reference clock signal and providing an output fourth signal indicative of said count at said signal output thereof; and compare fifth means, connected to said fourth means to receive the count fourth signal and including increment an decrement signal output means, for comparing the count value of said fourth signal with a predetermined allowable range of counts and providing one of an increment and decrement signal to said signal output means thereof in accordance with whether the count exceeds or is less than said predetermined allowable range.

2. Apparatus as claimed in claim 1 wherein said data signals are of the NRZ (non-return-to-zero) type and comprising, in addition:

retiming logic means, connected to said second and third means to receive data and clock signals therefrom and including retimed data output means, for retiming the data received to be phase related to the clock signal in a predetermined manner.

3. Apparatus as claimed in claim 1 wherein said logic signal fourth means comprises:

logic level change detection sixth means, connected to receive each of said first signals and said data signals, for providing given logic level output sixth signals for each received first signal that occurs while the data signal is at a given logic level; and summing seventh means, connected to said third means, for providing the count output signal by summing the output sixth signals that are at said given logic level when the clock signal changes logic levels in a given direction.

4. The method of digitally detecting the phase of a data signal with respect to a clock signal which may be asynchronous with respect to the data signal having a given range of frequencies comprising the steps of:

generating a plurality N of phase related reference signals of a frequency within said range of frequencies where the phase difference in degrees between related reference signals is 360/N;

counting the number of phase related reference signals which change to a given logic value between the commencement of a data signal and the commencement of a clock signal;

comparing the count with an allowable range of counts; and issuing an output signal if the comparison detects that the count is outside the allowable range of counts.

5. The method of claim 4 where the issued output signal is one of a phase altering increment and decrement signal.

6. The method of digitally detecting the phase of a data signal with respect to a clock signal which may be asynchronous with respect to the data signal having a given range of frequencies comprising the steps of:

generating a plurality N of phase related reference first signals of a frequency within said range of frequencies where the phase difference in degrees between signals is 360/N and one complete electrical cycle occurs in time T;

generating a plurality of second signals each commencing a first given logic level with the start of a corresponding first signal while the data signal is in a second given logic condition and maintaining said first given logic level for the longer of time T and the duration of the data signal in said second given logic condition;

generating a plurality of third signals, corresponding to those second signals which are at said first given logic level at the time of commencement of the clock signal; and counting the number of third signals as an indication of phase difference between the commencement of a data pulse and the commencement of the clock signal.

7. Apparatus for digitally detecting the phase of a data signal with respect to a clock signal which is asynchronous with respect to the data signal having a given range of frequencies comprising, in combination:

first means for supplying a clock first signal;

second means for supplying a NRZ (non-return-to-zero) data second signal;

third means for generating a plurality N of phase related reference third signals of a frequency within said range of frequencies where the phase difference in degrees between signals is 360/N and one complete electrical cycle occurs in time T;

fourth means, connected to said second and third means, for generating a plurality of fourth signals each commencing a first given logic level with the start of a corresponding third signal while the data second signal is in a second given logic condition and maintaining said first given logic level for the longer of time T and the duration of the data second signal in said second given logic condition;

fifth means, connected to said first and fourth means, for generating a plurality of fifth signals, corresponding to those fourth signals which are at said first given logic level at the time of commencement of the clock first signal; and sixth means, connected to said fifth means, for counting the number of fifth signals as an indication of phase difference between the commencement of a data second signal and the commencement of the clock first signal.

* * * * *